United States Patent [19]
Johnson et al.

[11] Patent Number: 5,834,062
[45] Date of Patent: Nov. 10, 1998

[54] MATERIAL TRANSFER APPARATUS AND METHOD OF USING THE SAME

[75] Inventors: Timothy L. Johnson, Tempe; James H. Knapp, Chandler; Albert J. Laninga, Tempe, all of Ariz.

[73] Assignee: Motorola, Inc., Schaumburg, Ill.

[21] Appl. No.: 929,232

[22] Filed: Sep. 3, 1997

Related U.S. Application Data

[63] Continuation of Ser. No. 671,436, Jun. 27, 1996, abandoned.

[51] Int. Cl.$^6$ .............................. B05D 5/00; B05C 1/00; B23K 1/00
[52] U.S. Cl. .................... 427/256; 427/96; 427/208.6; 118/208; 118/211; 118/221; 118/120; 118/520; 118/243; 228/33; 228/35; 228/43; 228/180.22; 29/878; 29/843
[58] Field of Search .................... 427/256, 96, 208.6; 118/208, 221, 120, 401, 412, 423, 500, 225, 256, 243, 211; 228/165, 33, 34, 35, 43, 180.21, 180.22; 222/162, 163, 518; 29/878, 842, 843, 739

[56] References Cited

U.S. PATENT DOCUMENTS

| | | | |
|---|---|---|---|
| 4,466,400 | 8/1984 | Irimajiri et al. | 123/193 P |
| 4,487,179 | 12/1984 | Hercher | 123/307 |
| 4,594,961 | 6/1986 | Beris et al. | 118/212 |
| 4,711,201 | 12/1987 | Ooyama et al. | 123/73 A |
| 4,796,560 | 1/1989 | Berger et al. | 118/211 |
| 5,249,732 | 10/1993 | Thomas | 228/179.1 |

FOREIGN PATENT DOCUMENTS

| | | | |
|---|---|---|---|
| 409582 | 1/1991 | European Pat. Off. | B23K 20/00 |

*Primary Examiner*—Shrive Beck
*Assistant Examiner*—Michael Barr
*Attorney, Agent, or Firm*—Kenneth M. Seddon; Daniel R. Collopy

[57] ABSTRACT

A material (21) is transferred to an electronic component (32) using a transfer apparatus (10). The transfer apparatus (10) has pins (13) that pass through openings (19) in a cavity plate (16). The pins (13) and the openings (19) in the cavity plate (16) form cavities (20) that are filled with the material (21). The pins (13) are then extended from the cavity plate (16) to transfer the material (21) from the cavities (20) to the electronic component (32).

21 Claims, 2 Drawing Sheets

MATERIAL TRANSFER APPARATUS AND METHOD OF USING THE SAME

This application is a continuation of prior application Ser. No. 08/671,436, filed Jun. 27, 1996 now abandoned.

BACKGROUND OF THE INVENTION

This invention relates, in general, to electronic components, and more particularly to a method of transferring a material to an electronic component during the manufacture of the electronic component.

The bonding process of many electronic components includes the step of applying a flux or other material to the bonding pads of the electronic component. The flux is used as an adherent to hold solder balls in place on the bonding pads, until a re-flow process has been performed. In placing the flux on an electronic component, it is important that the flux be placed in the proper location and in the proper amount to avoid electrically shorting various portions of the electronic component together during the re-flow process.

One method for applying flux uses a silk screening technique where a hard mask is applied over an electronic component. The silk screen mask includes holes that expose the bonding pads of the underlying electronic component. The flux material is then placed on the silk screen and forced into the holes of the silk screen using a squeegee-like apparatus. However, due to the natural tendency of flux material to wet or flow, such processes generally require that neighboring openings in the silk screen be at least 750 microns (30 mils) apart from each other to avoid shorting.

A second method uses an array of solder balls to transfer the flux material and solder balls to the electronic component. The solder balls in the array are arranged so that they are matched to the bonding pads of the electronic component. The array of solder balls is then dipped into a well of flux material so that some flux remains on each of the solder balls. The array is then aligned and placed in contact so that the fluxed solder balls are applied to the bonding pads of the electronic component.

The problem with this technique is that the planarity of the electronic component or the planarity of the well of flux material can affect the amount of flux being applied to the solder balls. This can result in an unequal amount of flux being transferred across the electronic component. As a result, this type of transfer process is difficult to use with a bonding pad pitch smaller than 1 millimeter or a solder ball size of less than 0.5 millimeter.

A third transfer technique uses an array of pins to transfer the flux material. The pins in the array are arranged so that they are matched to the bonding pads of the electronic component. The array of pins is then dipped into a well of flux material and placed in contact so that flux is transferred from the pins to the bonding pads of the electronic component.

This technique, however, requires frequent cleaning of the pins to remove the residual flux material that builds up on the pins. It is also difficult to control the amount of flux being applied and to transfer high viscosity materials. As a result, this type of transfer process is not practical to use with bonding pads that are smaller than 500 microns (20 mils) and have a pitch of less than 1 millimeter.

By now it should be appreciated that it would be advantageous to provide an improved method for transferring flux to an electronic component. It would also be advantageous if the method could transfer flux to bonding pads that are smaller than 500 microns and that were not planar. It would even be more advantageous if the method was self-cleaning and could be used to transfer materials other than flux.

DETAILED DESCRIPTION OF THE DRAWINGS

In general, the present invention provides a novel material transfer apparatus to be used to transfer a material such as flux to an electronic component. The apparatus has a cavity plate that is used to control the amount of flux that is transferred and cleans the pins that are used to transfer the flux. In the preferred embodiment, the pins are mounted to a support plate with springs so that each pin can move a different distance, if necessary, to compensate for a non-planar bonding surface.

Figure 1:
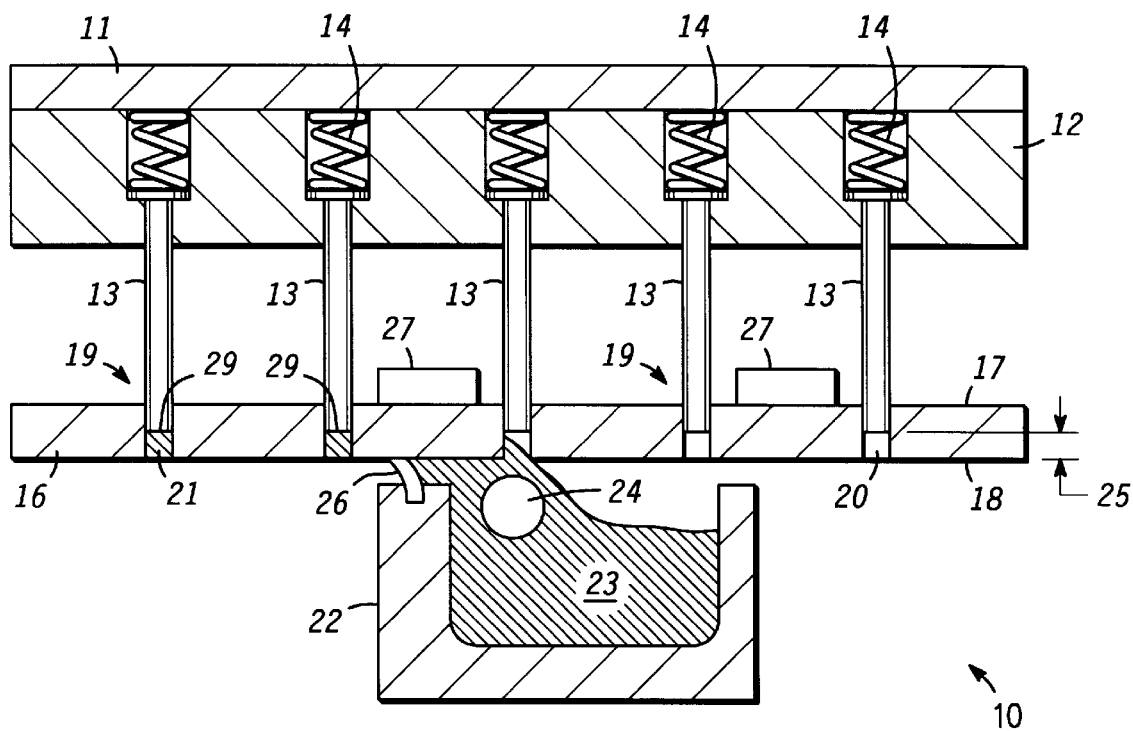
FIG. 1 is an enlarged cross-sectional view of a material transfer apparatus in accordance with the present invention.

Turning now to FIG. 1, a more detailed description of the present invention is provided. FIG. 1 is an enlarged cross-sectional view of a material transfer apparatus or a transfer apparatus 10. Transfer apparatus 10 includes pins 13 that are each connected to a support plate 11 by a spring 14 and a pin retainer plate 12. Pins 13 are coupled to support plate 11 so that as support plate 11 moves, pins 13 move in the same direction and a distance less than or equal to the movement of support plate 11.

Transfer apparatus 10 also includes a cavity plate 16 that has a top surface 17, a bottom surface 18, and has openings 19 that pass through cavity plate 16 from the bottom surface 18 to the top surface 17. Openings 19 are positioned and sized so that pins 13 can pass through cavity plate 16 via openings 19. Stopping blocks 27 are optionally formed on either cavity plate 16 or pin retainer plate 12 to control the distance that pins 13 extend from bottom surface 18 of cavity plate 16 as will be explained shortly.

A process for transferring a material is now provided beginning with filling a portion of openings 19 with the material to be transferred. As shown in FIG. 1, pins 13 are placed in a first position as indicated by a first distance 25 relative to bottom surface 18 of cavity plate 16. Pins 13 are moved so that the tips 29 of pins 13 are placed between top surface 17 and bottom surface 18. This will form a cavity 20 in cavity plate 16 using pins 13 and openings 19. Cavity 20 has a depth, indicated by first distance 25, and a width to provide a volume that is available to be filled with a material to be transferred.

Cavities 20 can be filled using a variety of techniques such as the one shown in FIG. 1. A well 22 of a material 23 is placed in contact with cavity plate 16 so that openings 19 are in contact with material 23. The present invention can be used in a variety of applications as material 23 can be a solder paste, an adhesive material, a solder, a conductive epoxy, or a flux material. A roller 24 is used to elevate a portion of material 23 to fill each cavity 20. Well 22 is moved across the bottom surface 18 of cavity plate 16 and any excess material that remains on bottom surface 18 is removed with a squeegee 26, leaving only a portion of material 21 in each cavity 20.

Figure 2:
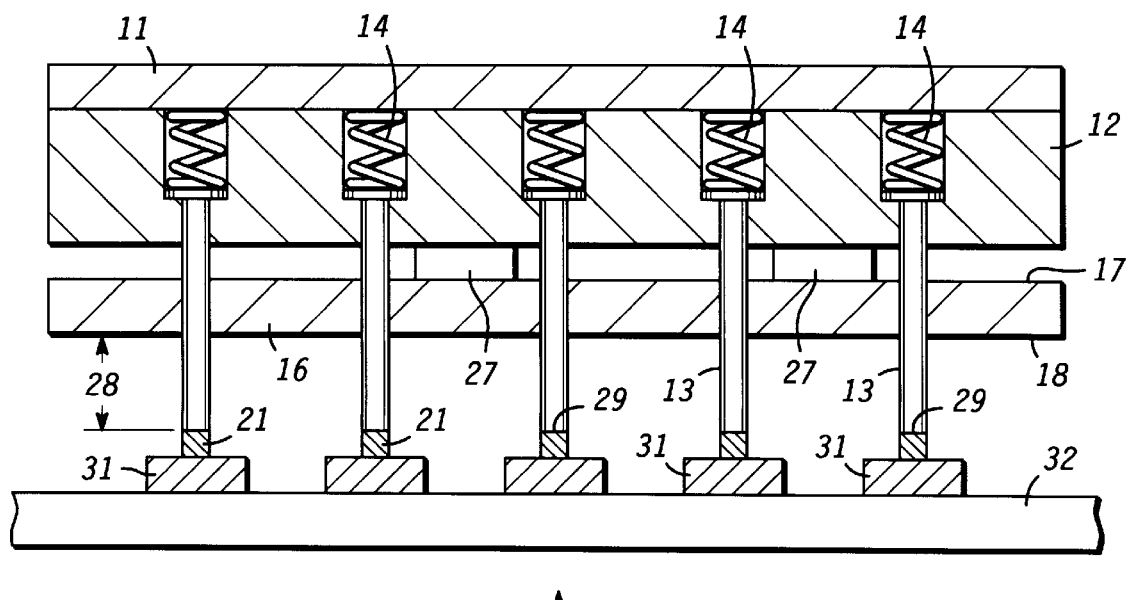
FIG. 2 is an enlarged cross-sectional view of the material transfer apparatus at an intermediate point in the material transfer process.

Turning now to FIG. 2, the process of transferring portion of material 21 continues by moving pins 13 to a second position so that pins 13 extend beyond the bottom surface 18 of cavity plate 16. An example of the second position is indicated by a second distance 28 and is determined by the length of pins 13, the distance between pin retainer plate 12 and cavity plate 16, and the width of stopping blocks 27. As shown in FIG. 2, stopping blocks 27 are used to control the amount that pins 13 can extend from transfer apparatus 10. Moving pins 13 to the second position is intended to place material 21 on tips 29 of pins 13 in contact with bonding pads 31 of an electronic component 32. When material 21 is in contact with the receiving component, the flux can then be heated to assist in the transfer of material 21 from tips 29 of pins 13 to bonding pads 31. The step of heating the flux should be considered optional and can be performed by directly heating pins 13 or providing a plasma discharge near tips 29.

Figure 3:
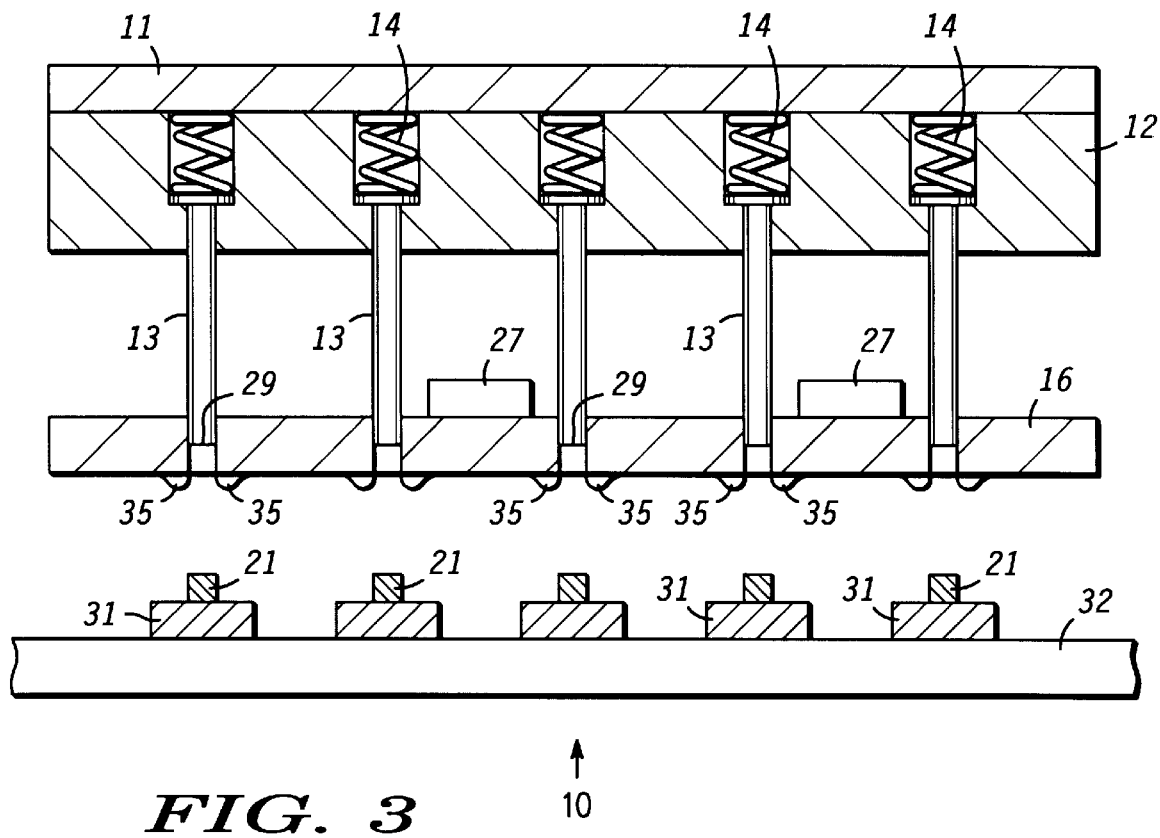
FIG. 3 is an enlarged cross-sectional view of the material transfer apparatus after the material transfer process is complete.

FIG. 3 shows transfer apparatus 10 and electronic component 32 after the transfer of material 21 is complete. Pins 13 are retracted so that tips 29 pass through openings 19 on bottom surface 18. This motion will clean pins 13 by removing any residual material that might remain on pins 13. The residual material is shown in FIG. 3 as material 35 and is gathered on bottom surface 18 of cavity plate 16. The excess material 35 is then removed by repeating the filling process shown in FIG. 1 as part of a second transfer process to a second electronic component (not shown). As well 22 is again passed along bottom surface 18, squeegee 26 will remove material 35 as cavities 20 are filled.

The present invention, therefore, provides a method of transferring flux that does not require a separate cleaning step to remove residual flux. Any material that might remain on tips 29 of pins 13 is simply reused as cavities 20 are filled for the next transfer operation. The present invention also provides a transfer operation that has a high degree of control of the amount of material 21 that is transferred. In the preferred embodiment, pins 13 have a width of about 0.3 millimeters to 1 millimeter and cavities 20 have a depth (see FIG. 2) of about 0.3 millimeters to 1 millimeter. By adjusting the location of pins 13, the size of cavities 20 can be controlled, and thus the volume of material 21 to be transferred can be controlled. Due to the self-cleaning feature of the present invention and the relatively small size of pins 13, it is possible to transfer material to structures that are within about 0.3 millimeters to 1 millimeter of each other.

An additional benefit of the present invention is that springs 14 (see FIG. 2) allow each pin 13 to extend a different distance if electronic component 32 is not exactly planar. For example, if some of bonding pads 31 are higher than others, then pins 13 that would contact the higher bonding pads are free to retract towards transfer apparatus 10 so that all pins 13 can contact the appropriate bonding pad 31 of electronic component 32.

Figure 4:
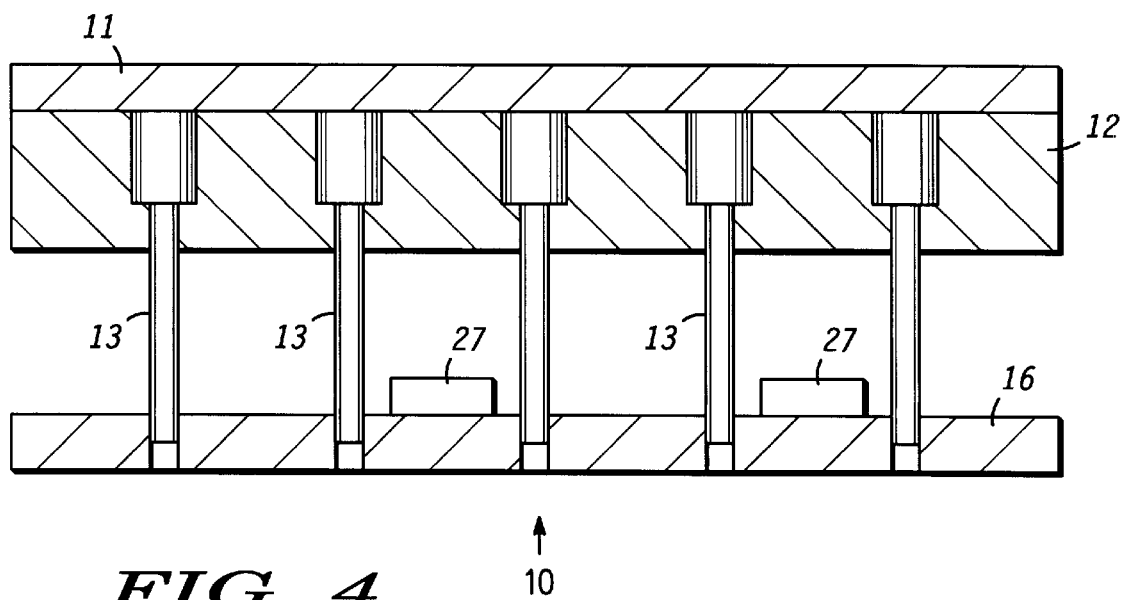
FIG. 4 is an enlarged cross-sectional view of an alternate embodiment of the material transfer apparatus in accordance with the present invention.

Turning now to FIG. 4, an alternate embodiment of transfer apparatus 10 is provided. As shown in FIG. 4, pins 13 are directly connected to support plate without the use of a spring. Thus, pins 13 move substantially the same distance that support plate 11 moves during the transfer operation. Such a configuration may have application where it is necessary for each of pins 13 to apply an equal pressure during the transfer operation.

It should be understood that transfer apparatus 10 can be used to transfer different materials to a variety of structures and is not limited to only transferring flux to an electronic component. Transfer apparatus 10 could also be used to transfer flux or adhesive material to a glass substrate, a ceramic package, a plastic package, a printed circuit board, a lead frame, a semiconductor substrate, or the like. It should also be understood that it is possible to fill cavities 20 with a material by immersing bottom surface 18 of cavity plate 16 into a material with tips 29 of pins 13 being flush with bottom surface 18 and then moving pins 13 to the first position (see FIG. 1) so that the material is drawn into each cavity 20. In the preferred embodiment, support plate 11, pin retainer plate 12, pins 13, and cavity plate 16 are machined in stainless steel. Other materials such as gold, aluminum, nickel, plastic, or the like may also be suitable.

By now it should be appreciated that the present invention provides a material transfer apparatus and a method for its use. The transfer apparatus uses a cavity plate and a pin to control the amount of a material that is transferred. In addition, the cavity plate also removes any residual material from the pins at the end of each transfer operation to improve the distribution of the material during the next transfer operation. These features allow the present invention to transfer material at a much smaller pitch than is possible with some previously known techniques, and can do so with improved control and reduced manufacturing cost.

We claim:

1. A material transfer apparatus comprising:
   a support plate movable between a first position and a second position;
   a pin having a width and coupled to the support plate so that the support plate directs the pin to the first position and to the second position, wherein the pin has sidewalls;
   a cavity plate having an opening so that the pin can pass through the cavity plate and the opening, wherein the pin and the cavity plate provide a cavity in the cavity plate when the pin is in the first position, at least a portion of the pin extends from the cavity plate when the pin is in the second position, and the pin has a clearance in the cavity such that the pin prevents material from passing along the sidewalls of the pin when material is placed in the cavity; and
   a well of material that is movable along the bottom surface of the flux transfer apparatus and fills the cavity in the cavity plate with a portion of the material when the pin is in the first position.

2. The material transfer apparatus of claim 1 further comprising a well of a material that fills the cavity with a portion of the material when the pin is in the first position.

3. The material transfer apparatus of claim 2 wherein the material is selected from the group consisting of a solder paste, an adhesive material, a solder, a conductive epoxy, and a flux.

4. The material transfer apparatus of claim 1 wherein the pin is coupled to the support plate by a spring that allows the pin to move a distance equal to or less than the support plate moves.

5. The material transfer apparatus of claim 1 wherein the pin is attached to the support plate so that the pin moves a distance that is substantially equal to a distance that the support plate moves.

6. The material transfer apparatus of claim 1 wherein the pin has a width that is substantially equal to a width of the opening in the cavity plate.

7. The material transfer apparatus of claim 6 wherein the width of the pin is about 0.3 millimeters to 1 millimeter.

8. The material transfer apparatus of claim 7 wherein when the pin is in the first position, the cavity has a depth of about 0.3 millimeters to 1 millimeter.

9. The material transfer apparatus of claim 1 wherein the opening in the cavity plate has sidewalls that are substantially parallel to the pin.

10. The material transfer apparatus of claim 1 wherein the material transfer apparatus is devoid of an air gap along the sidewalls of the pin.

11. A flux transfer apparatus comprising:

a support plate;

a cavity plate having a top surface, a bottom surface, and an opening through the cavity plate from the top surface to the bottom surface;

a pin connected to the support plate, wherein the pin has a tip and the pin is movable to place the tip in a first position that is in the opening of the cavity plate to provide a cavity, and the tip is movable to a second position that extends beyond the bottom surface of the cavity plate;

a means for filling the cavity with solder that is moveable along the bottom surface of the flux transfer apparatus and that fills the cavity in the cavity plate with the solder when the pin is in the first position; and wherein the pin has a clearance in the cavity that prevents solder from passing along the sidewalls of the pin when the pin is in the first position and solder is placed in the cavity.

12. The flux transfer apparatus of claim 11 wherein a portion of the flux material in the cavity is transferred to an electronic component when the pin is in the second position.

13. The flux transfer apparatus of claim 11 wherein the pin is coupled to the support plate by a spring that allows the pin to move a distance equal to or less than the support plate moves.

14. The flux transfer apparatus of claim 11 wherein the pin is attached to the support plate so that the support plate moves a distance that is substantially equal to a distance that the pin moves.

15. The flux transfer apparatus of claim 11 wherein the pin has a width of about 0.3 millimeters to 1 millimeter, and the width of the pin is substantially equal to a width of the opening in the cavity plate.

16. A method of manufacturing an electronic component by transferring a material comprising the steps of:

providing a support plate that has a pin, the pin having a width and a tip;

providing a cavity plate that has an opening that has a width that is substantially equal to the width of the pin, and the opening allows the pin to pass through the cavity plate;

placing the cavity plate in contact with a well of the material so that the opening in the cavity plate is in contact with a portion of the material; and moving the pin to a position between a top surface and a bottom surface of the cavity plate to fill the at least a portion of the opening with the material in the well, wherein the width of the pin is sufficient to prevent the material from passing beyond the tip of the pin; and moving the pin through the opening in the cavity plate so the pin extends a first distance from the cavity plate to transfer the material out of the opening.

17. The method of claim 16 wherein the step of moving the pin through the opening moves the material in the opening onto the pin and a portion of the material on the pin is transferred to an electronic component.

18. The method of claim 17 wherein the material is selected from the group consisting of a solder paste, an adhesive material, a solder, a conductive epoxy, and a flux.

19. The method of claim 16 wherein the pin is connected to the support plate by a spring that allows the pin to move a distance equal to or less than the support plate.

20. The method of claim 16 wherein the pin is attached to the support plate so that the support plate moves a distance that is substantially equal to a distance that the pin moves.

21. A material transfer apparatus for placing a material on a bonding pad comprising:

a support plate movable between a first position and a second position;

a pin having a width and coupled to the support plate so that the support plate directs the pin to the first position and to the second position, wherein the pin has sidewalls;

a cavity plate having an opening so that the pin can pass through the cavity plate and the opening, wherein the cavity plate provides a cavity when the pin is in the first position and the cavity has a width that is substantially constant and equal to the width of the pin;

a means for filling the cavity with material; and wherein at least a portion of the pin extends from the cavity plate when the pin is in the second position, thereby being capable of directing material onto the bonding pad.

* * * * *